United States Patent [19]
Orbach et al.

[11] Patent Number: 4,933,738
[45] Date of Patent: Jun. 12, 1990

[54] CUSTOMIZABLE SEMICONDUCTOR DEVICES

[75] Inventors: Zvi Orbach; Meir I. Janai; Uzi Yoeli, all of Haifa; Gideon Amir, Ra'anana, all of Israel

[73] Assignee: Elron Electronic Industries, Ltd., Haifa, Israel; a part interest

[21] Appl. No.: 222,514

[22] Filed: Jul. 21, 1988

[30] Foreign Application Priority Data

Apr. 25, 1988 [IL] Israel .......................... 86162

[51] Int. Cl.[5] .................. H01L 27/02; H01L 21/10; H01L 27/15; H01L 23/48
[52] U.S. Cl. ......................... 357/51; 357/40; 357/45; 357/71
[58] Field of Search ............ 357/51, 40, 45, 51, 357/71

[56] References Cited

U.S. PATENT DOCUMENTS

| | | |
|---|---|---|
| 4,124,899 | 11/1978 | Birkner et al. |
| 4,197,555 | 4/1980 | Uehara et al. .................. 357/71 |
| 4,233,671 | 11/1980 | Gerzberg et al. |
| 4,295,149 | 10/1981 | Balyoz et al. .................. 357/45 |
| 4,677,452 | 6/1987 | Zommer .................. 357/41 |

FOREIGN PATENT DOCUMENTS

| | | |
|---|---|---|
| 0210397 | 6/1986 | European Pat. Off. |
| 53-78789 | 7/1978 | Japan .................. 357/71 |

OTHER PUBLICATIONS

C. J. Boisvert, "One Day Prototype Laser Programmed Arrays", *Laserpath One Day Gate Arrays*, (Feb. 1986), 6 pages.

J. I. Raffel et al., "A Wafer-Scale Digital Integrator Using Restructurable VSLI", *IEEE Jour. of Solid State Circuits*, vol. sc-20, No. 1, Feb. 1985.

*Primary Examiner*—J. Carroll
*Attorney, Agent, or Firm*—Cushman, Darby & Cushman

[57] ABSTRACT

A selectably customizable semiconductor device first and second metal layers disposed in respective first and second planes and including respective first and second elongate strips, conductive branches being provided in association with the elongate strips.

27 Claims, 17 Drawing Sheets

FIG. BA-1
PRIOR ART
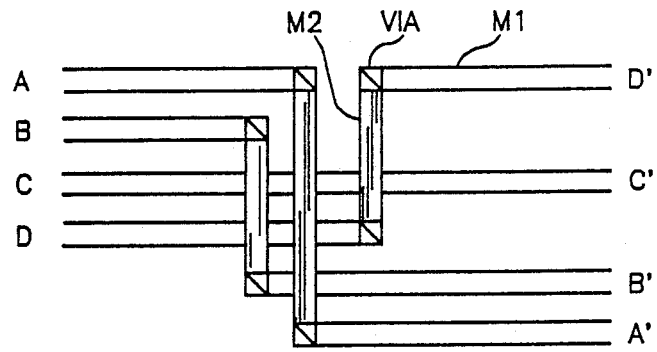
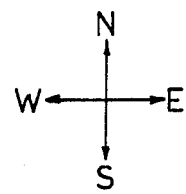

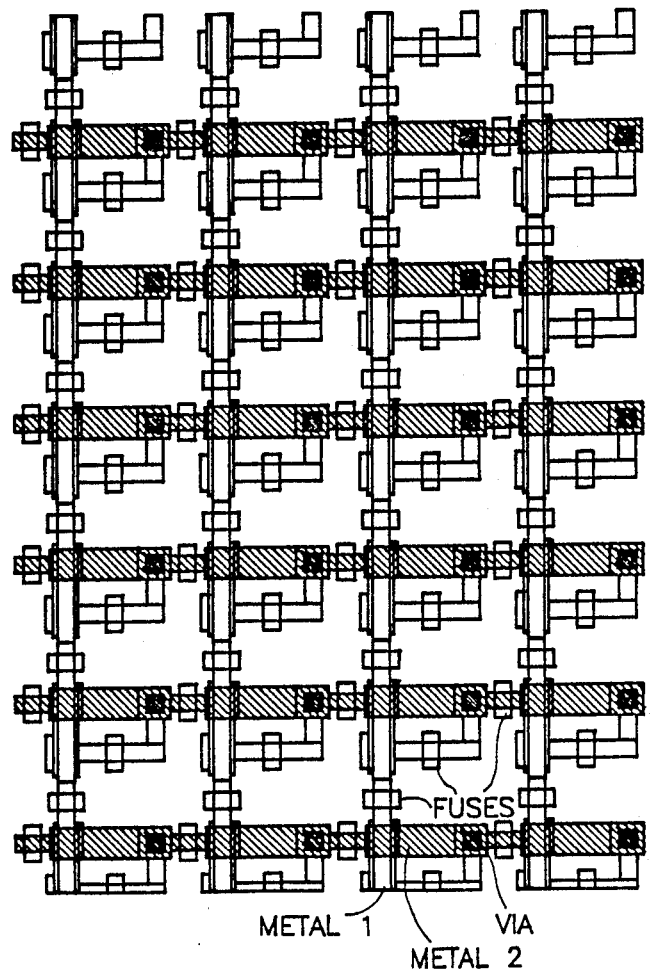
FIG.BA-2
PRIOR ART

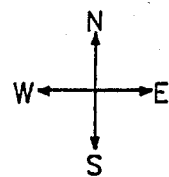
FIG.BA-3
PRIOR ART
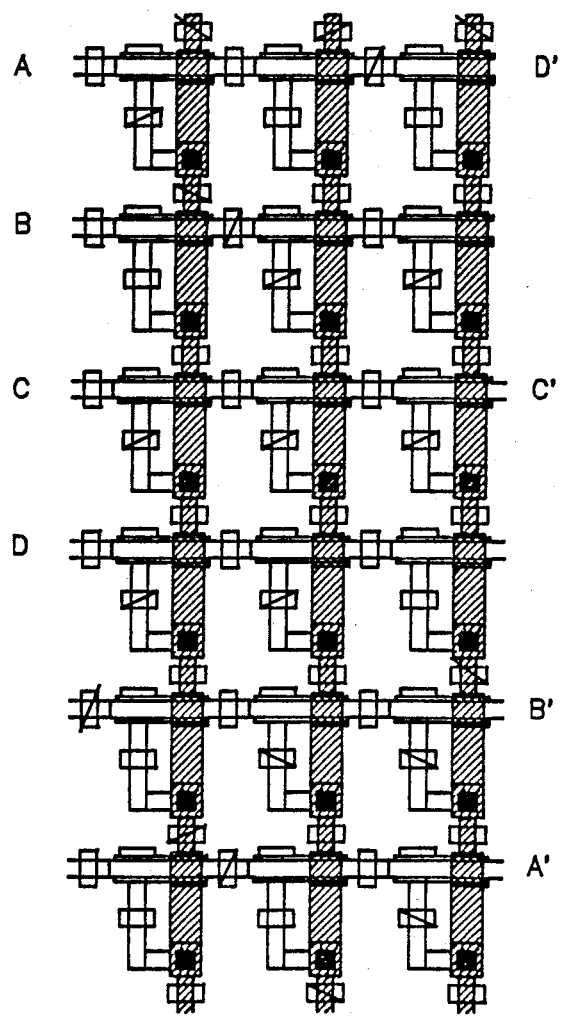

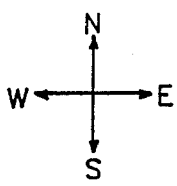
FIG.5
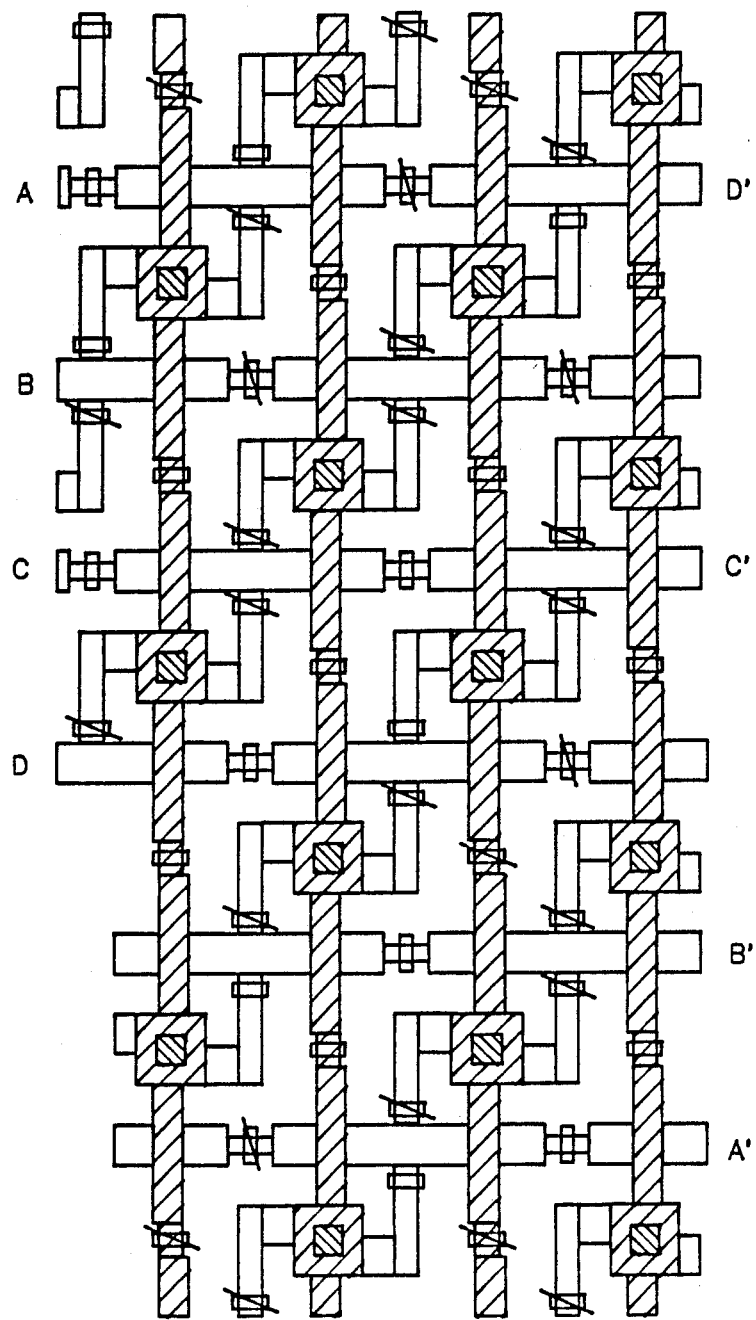

CUSTOMIZABLE SEMICONDUCTOR DEVICES

FIELD OF THE INVENTION

The Present invention relates to semiconductor devices generally and more particularly to customizable semiconductor devices.

BACKGROUND OF THE INVENTION

Integrated circuits are electronic circuits which normally include a very large number of semiconductor elements, such as transistors and diodes, as well as other electronic components in highly compact form on a silicon wafer. The basic principle underlying integrated circuits is that instead of building an electronic circuit out of discrete components such as transistors, diodes, resistors and capacitors, the entire circuit is fabricated on the same piece of silicon in the form of a number of superimposed layers of conducting, insulating and transistor forming materials. By arranging predetermined geometric shapes in each of these layers, a circuit having a required function is realized.

The process by which an integrated circuit is fabricated is long and complex and basically includes the following steps:

1. A polished silicon wafer is exposed to an appropriate material in a high temperature furnace in order to "grow" a uniform layer of the material on its surface.
2. After the wafer is cooled, it is coated with a thin film of resist material, which is dried and baked.
3. At the same time, a mask for the appropriate layer is created, which defines the precise pattern required on the silicon surface.
4. This mask is brought firmly into proximity with the coated wafer and exposed to intense ionizing radiation such as ultraviolet light or low-energy x-rays. In areas wherein the mask is transparent to such radiation., the ionizing radiation passes into the resist and breaks down its molecular structure. The portions of the resist that are covered by opaque portions of the mask are not affected.
5. The resist is then developed by immersing the silicon wafer in a solvent which dissolves the resist only at the locations which were exposed to the ionizing radiation.
6. The wafer is then exposed to an appropriate etching material which is effective to remove the material grown previously thereon (Step 1), except where the material is covered by resist, thus defining a desired pattern of the grown material.
7. The remaining resist material is then removed.

The above process is repeated for each of the layers of material forming the integrated circuit. In most integrated circuit technology one or more layers of metal are employed for internal connections on the integrated circuit. These metal layers are usually formed last.

As can be readily appreciated, the above process requires sophisticated machinery and custom masks which must be specially set up for each specific type of custom integrated circuit to be fabricated. For the process to be at all economical, extremely large quantities of integrated circuits must be produced for a given set up. Since there exist applications wherein the quantities desired of a specific circuit are not extremely large techniques have been developed for producing integrated circuits known as gate arrays In these gate arrays, a large amount of transistors and other components are produced by the above-described mass production techniques. Specific interconnections therebetween suitable for a specific circuit are then formed on the chip by etching a suitable metal layer thereon. There exist advanced gate-arrays wherein two or more layers of custom metal interconnections may be custom etched.

Despite the use of sophisticated computer aided design and semi-custom devices, the widespread use of dedicated non-standard integrated circuits is still limited because of the high costs and long lead time involved in their fabrication. Many users of integrated circuits still make extensive use of standard, "off the shelf" available small scale and medium scale integrated circuits.

Electronic circuits manufactured by combining a large number of such standard integrated circuits have a number of disadvantages:

a. A large number of printed circuit boards are required, resulting in an expensive product, relatively long assembly time, relative difficulty in maintenance and troubleshooting and large size.

b. Lower electrical power efficiency is realized. As a result, relatively larger power sources are required and heavier and larger products result.

There are known integrated circuits such as EPROMS and PALS (programmable array logic) which are programmed by fusing which is accomplished electrically via the integrated circuit's input-/output pins, requiring elaborate extra fusing circuitry for this purpose.

There are also known techniques for increasing yield of integrated circuits by excising inoperative portions thereof by fusing. This is normally done on wafers including a multiplicity of integrated circuits.

It is also known to produce gate arrays which are laser programmable. Such devices are described in a publication of Laserpath, Inc. of Sunnyvale, CA 94086 USA entitled "One Day Prototype Laser Programmed Arrays" dated February 26, 1986.

Dual metal layer integrated circuit technology has been developed in recent years to enable automatic computer software controlled generation of integrated circuit layouts, commonly known as routing. In the early years of integrated circuit development, routing was done by hand. Due to the increased complexity and density of contemporary integrated circuits, manual routing is no longer possible.

Dual metal layer technology provides two independent routing layers extending in respective perpendicular directions, commonly termed North-South and East-West. Changes in direction are provided by vias which interconnect the two layers, the vias typically being defined by an opening in the insulating layer between the two metal layers, being filled by metal from one of the two layers. A simple dual metal layout wherein vias are positioned at the locations of the desired direction changes is shown in FIG. BA - 1, wherein the horizontal strips are typically a metal I layer, indicated as M1, the vertical strips are typically a metal II layer, indicated as M2 and the vias interconnecting the two layers are labelled. The metal II layer overlies the metal I layer.

In order to permit rapid customization of dual metal type integrated circuits, it is desired that such customization be solely produced by fuse disconnection rather than by applying metal across a gap. Accordingly, configurations such as that shown in FIG BA - 2 were developed to combine the advantages of automatic routing with those of rapid customization, such that customization can be carried out by an automatic routing technique. In the configuration of FIG BA - 2 the East-West strips are indicated to be metal 1 while the North-South strips are indicated to be metal 11 and a via connecting the metal I and metal II layers is disposed adjacent each crossing of the respective metal I and metal II strips. The via underlies the metal II strip and is joined to the metal I strip by means of a branch having a fuse formed thereon. Fuses are also provided along the metal II strips between adjacent vias and along the metal I strips between adjacent branches.

Customization of the blank shown in FIG. BA - 2 takes place by travelling along the metal I strips and fusing all fuses on the branches which are not used. If a direction change is desired, a branch is used to establish a connection to the metal II layer. When travelling along the metal II strips, if the desired direction of the strip is, for example, South, the fuses lying to the North are fused or vice versa. FIG. BA - 3 illustrates the equivalent circuit to that shown in FIG BA - 1 embodied in the structure of FIG. BA - 2, where /'s over the fuse indicate fused fuses.

SUMMARY OF THE INVENTION

The present invention seeks to provide selectably customizable semiconductor devices of the types described above which are compact and thus compatible with high-density architecture.

There is thus provided in accordance with a preferred embodiment of the present invention a selectably customizable semiconductor device comprising:

a first metal layer disposed in a first plane and including first elongate strips extending parallel to a first axis;

a second metal layer disposed in a second plane generally parallel to and electrically insulated from the first plane and including second elongate strips extending parallel to a second axis, said second axis being generally perpendicular to said first axis, whereby a multiplicity of elongate strip overlap locations ar defined at which the elongate strips of the first and second metal layers overlap in electrical insulating relationship;

the first metal layer including a plurality of fusible conductive bridges joining adjacent pairs of the first elongate strips, the fusible conductive bridges including first and second fusible links;

the first metal layer also including a plurality of branch strips, each branch strip connecting one of said fusible conductive bridges at a location intermediate the first and second fusible links to a branch overlap location spaced from the multiplicity of elongate strip overlap locations, an electrical connection being formed between the first metal layer and the second metal layer at each of the branch overlap locations.

Further in accordance with the foregoing embodiment of the present invention, the selectably customizable semiconductor device also comprises a fusible link formed on each strip of each of the pair of adjacent first elongate strips intermediate each pair of adjacent fusible conductive bridges.

Additionally in accordance with a preferred embodiment of the invention, the selectably customizable semiconductor device also comprises a fusible link formed on each of said second elongate strips intermediate each pair of adjacent branch overlap locations.

Further in accordance with a preferred embodiment of the invention there is provided a selectably customizable semiconductor device comprising:

a first metal layer disposed in a first plane and including first elongate strips extending parallel to a first axis;

a second metal layer disposed in a second plane generally parallel to and electrically insulated from the first plane and including second elongate strips extending parallel to a second axis, the second axis being generally perpendicular to said first axis, whereby a multiplicity of elongate strip overlap locations are defined at which the elongate strips of the first and second metal layers overlap in electrical insulating relationship;

the first metal layer including a plurality of fusible conductive bridges joining adjacent pairs of the first elongate strips, the fusible conductive bridges including first and second fusible links;

an electrical connection being formed between the first metal layer and the second metal layer at a plurality of branch overlap locations, the branch overlap locations being disposed along a fusible conductive bridge intermediate the first and second fusible links and overlapping the second elongate strips intermediate adjacent elongate strip overlap locations.

and wherein branch overlap locations overlapping adjacent parallel elongate strips are offset from each other such that they are not all aligned along a single line extending perpendicular to the parallel elongate strips.

Further in accordance with a preferred embodiment of the invention, in the selectably customizable semiconductor device the first metal layer is a metal I layer and the second metal layer is a metal II layer.

Alternatively in accordance with a preferred embodiment of the invention, the first metal layer is a metal II layer and the second metal layer is a metal I layer.

Further in accordance with this embodiment of the invention, the selectably customizable semiconductor device also comprises a fusible link formed on each strip of said pair of adjacent first elongate strips intermediate each pair of adjacent fusible conductive bridges.

Additionally in accordance with this embodiment of the invention the selectably customizable semiconductor device also comprises a fusible link formed on each of the second elongate strips intermediate each pair of adjacent branch overlap locations.

In accordance with a further preferred embodiment of the invention there is provided a selectably customizable semiconductor device comprising:

a first metal layer disposed in a first plane and including first elongate strips extending parallel to a first axis;

a second metal layer disposed in a second plane generally parallel to and electrically insulated from the first plane and including second elongate strips extending parallel to a second axis, the second axis being generally perpendicular to the first axis, whereby a multiplicity of elongate strip overlap locations are defined at which the elongate strips of the first and second metal layers overlap in electrical insulating relationship;

the first metal layer including a plurality of fusible conductive bridges joining adjacent pairs of the first elongate strips, the fusible conductive bridges including first and second fusible links;

an electrical connection being formed between the first metal layer and the second metal layer at a plurality of branch overlap locations, the branch overlap locations being disposed along a fusible conductive bridge intermediate the first and second fusible links and overlapping the second elongate strips intermediate adjacent elongate strip overlap locations, and wherein each of the fusible conductive bridges lies in overlapping codirectional relationship with the second elongate strips.

Additionally in accordance with this embodiment of the invention, the selectably customizable semiconductor device also comprises a third fusible link formed on each strip of the pair of adjacent first elongate strips intermediate each pair of adjacent fusible conductive bridges.

Alternatively in accordance with an embodiment of the invention, a third link is formed on each strip of said pair of adjacent first elongate strips at each fusible conductive bridge. Additionally in this embodiment of the invention the third fusible link is disposed adjacent to each of said first and second fusible links.

Additionally in accordance with this embodiment of the invention, the selectably customizable semiconductor device also comprises a fusible link formed on each of the second elongate strips intermediate each pair of adjacent branch overlap locations.

Additionally in accordance with a preferred embodiment of the invention, the first and second elongate strips are arranged in a regular grid pattern.

Further in accordance with a preferred embodiment of the invention, in the selectably customizable semiconductor device the first metal layer is a metal II layer and the second metal layer is a metal I layer.

In accordance with an additional embodiment of the present invention, there is provided an at least partially customized semiconductor device of any of the types described above and wherein at least some of said fusible links are fused.

Further in accordance with a preferred embodiment of the present invention there is provided a method for selectably customizing a customizable semiconductor device comprising the steps of:

providing a selectably customizable semiconductor device as described above; and selectably fusing some of said plurality of fusible links.

Additionally in accordance with the method described above, the selectably fusing step comprises applying laser radiation to some of the plurality of fusible links.

Further in accordance with the method described above, the selectably fusing step comprises chemically etching some of the plurality of fusible links.

Still further in accordance with the method described above, the selectably fusing step comprises ion milling some of the plurality of fusible links.

BRIEF DESCRIPTION OF THE DRAWINGS

The present invention will be understood and appreciated more fully from the following detailed description, taken in conjunction with the drawings in which:

FIG. BA - 1 illustrates a simple prior art dual metal layout wherein vias are positioned at the locations of desired direction changes;

Figure 1:
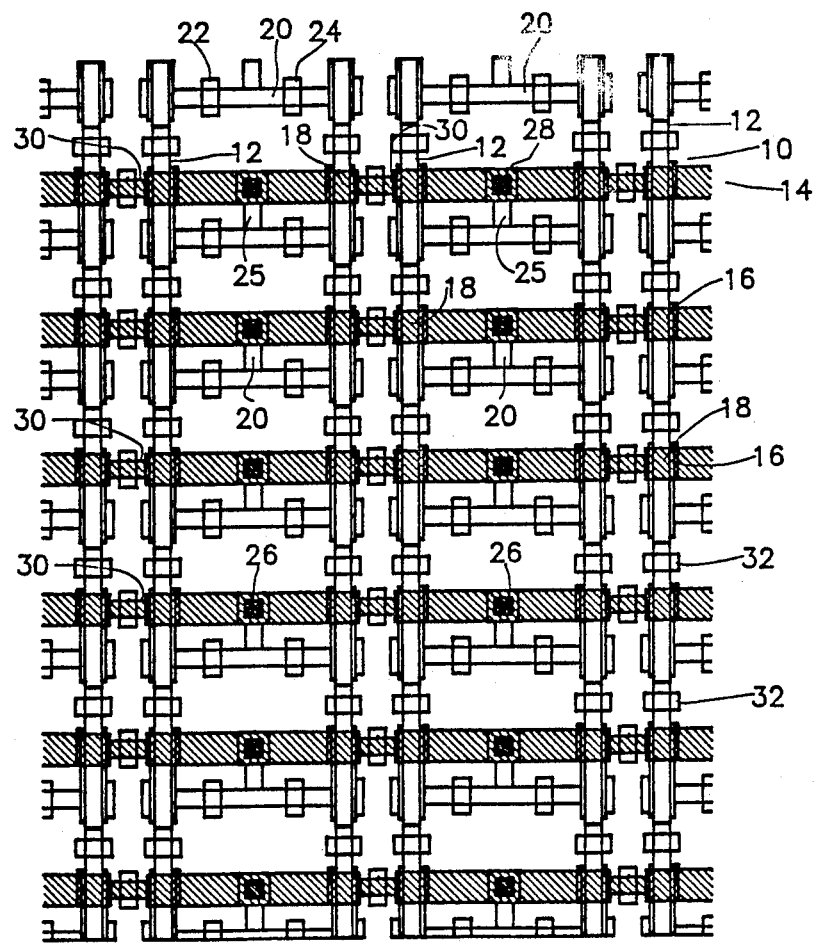
Figure 1:
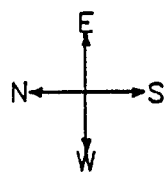
Figure 2:
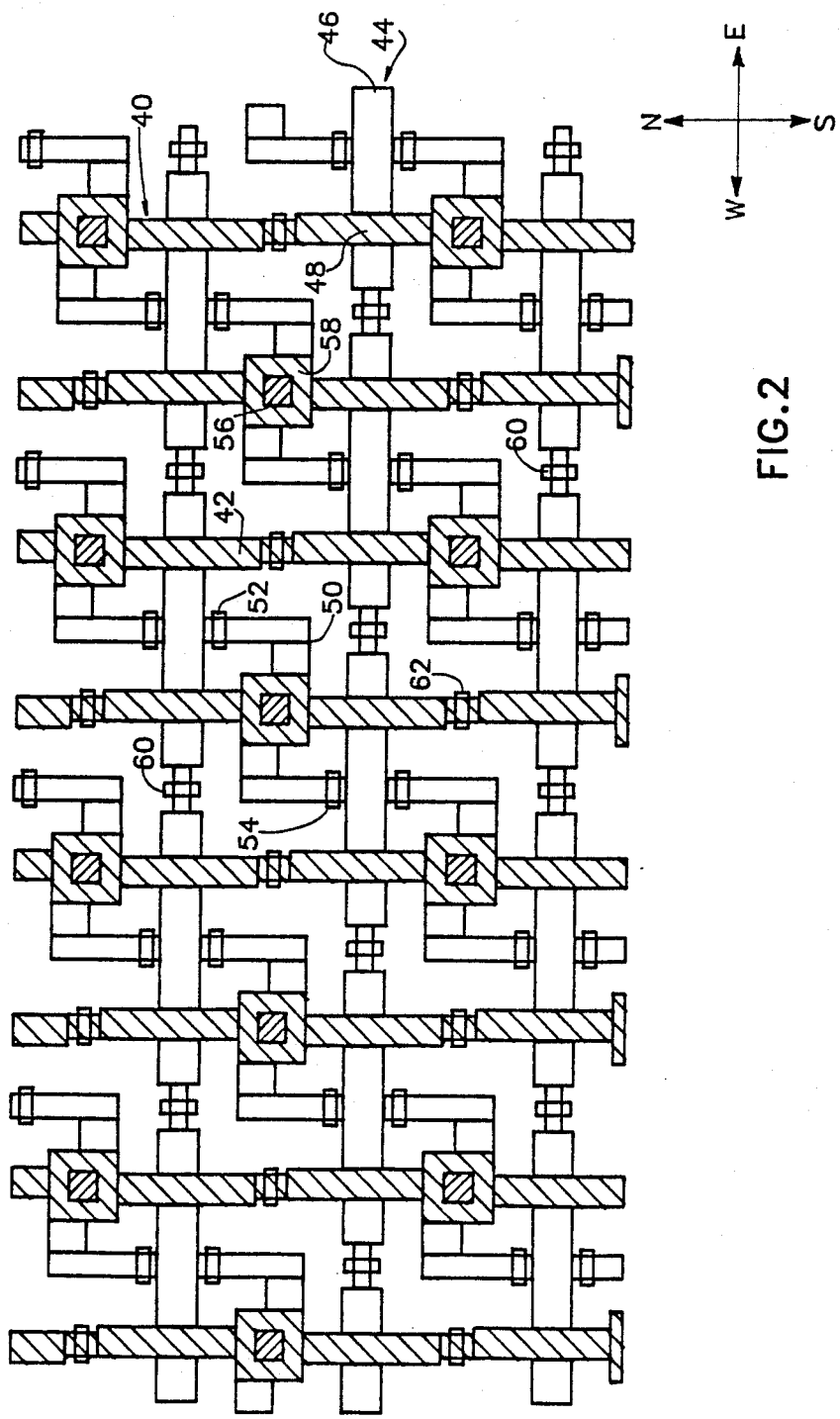
Figure 3:
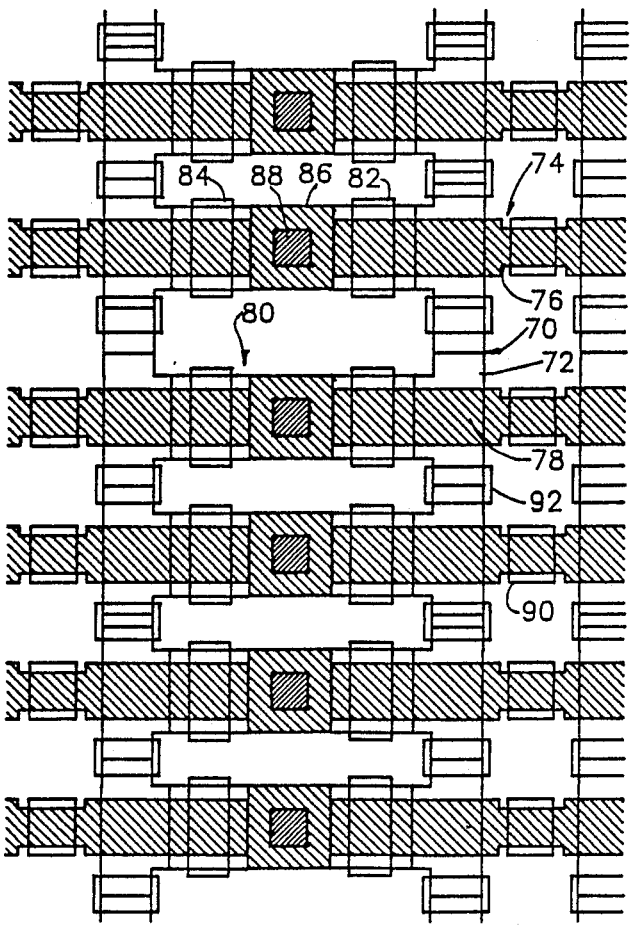
Figure 3:
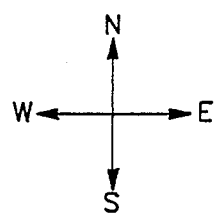
Figure 4:
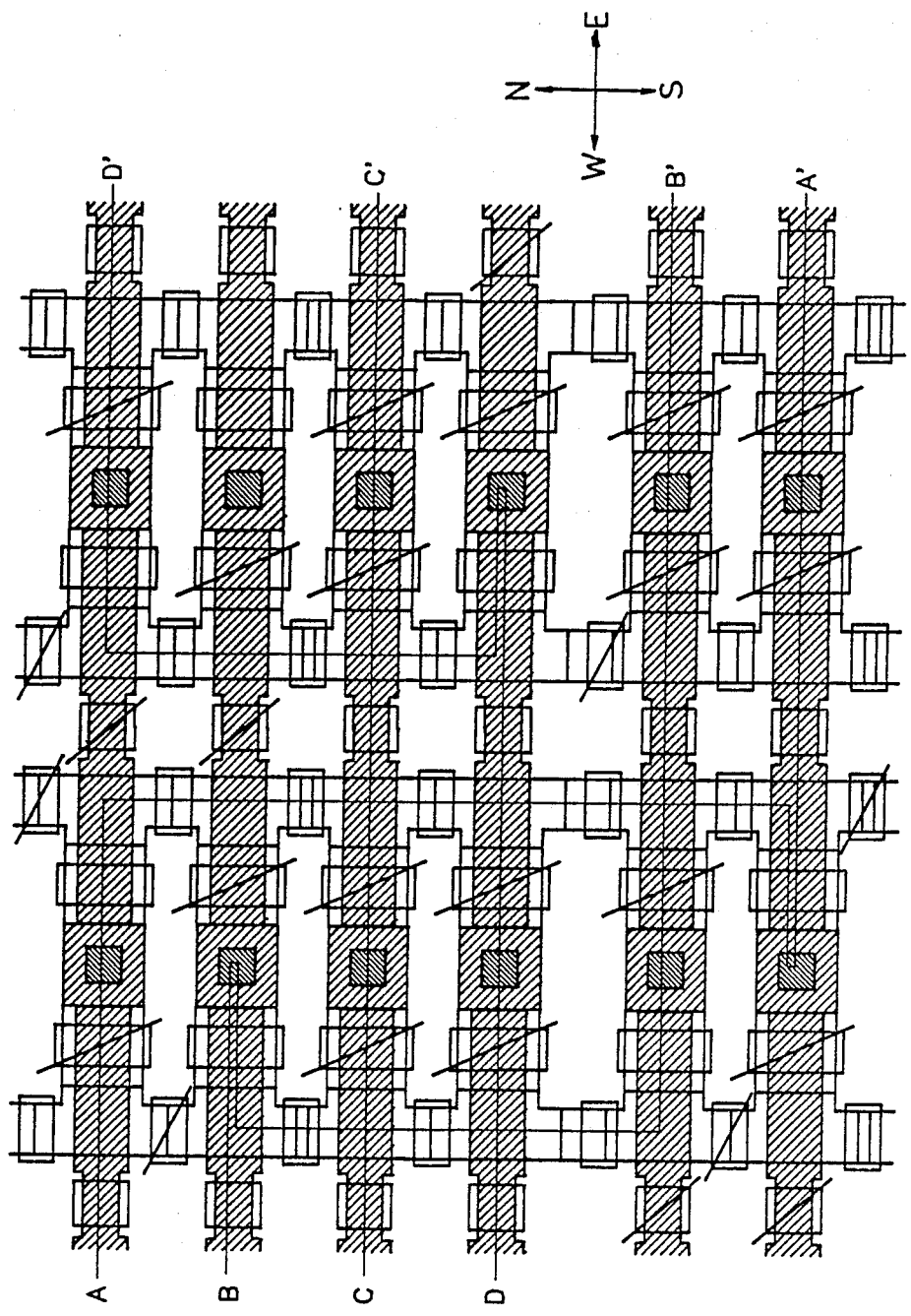
Figure 6:
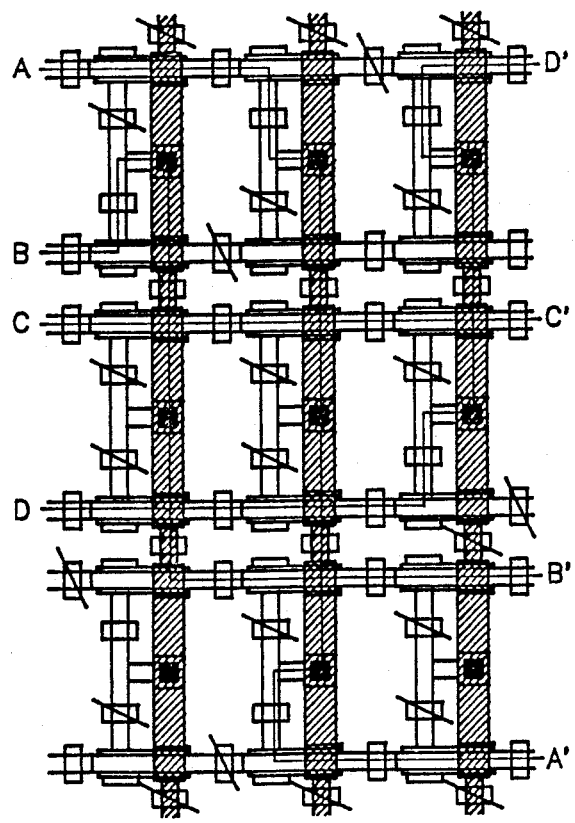
Figure 7:
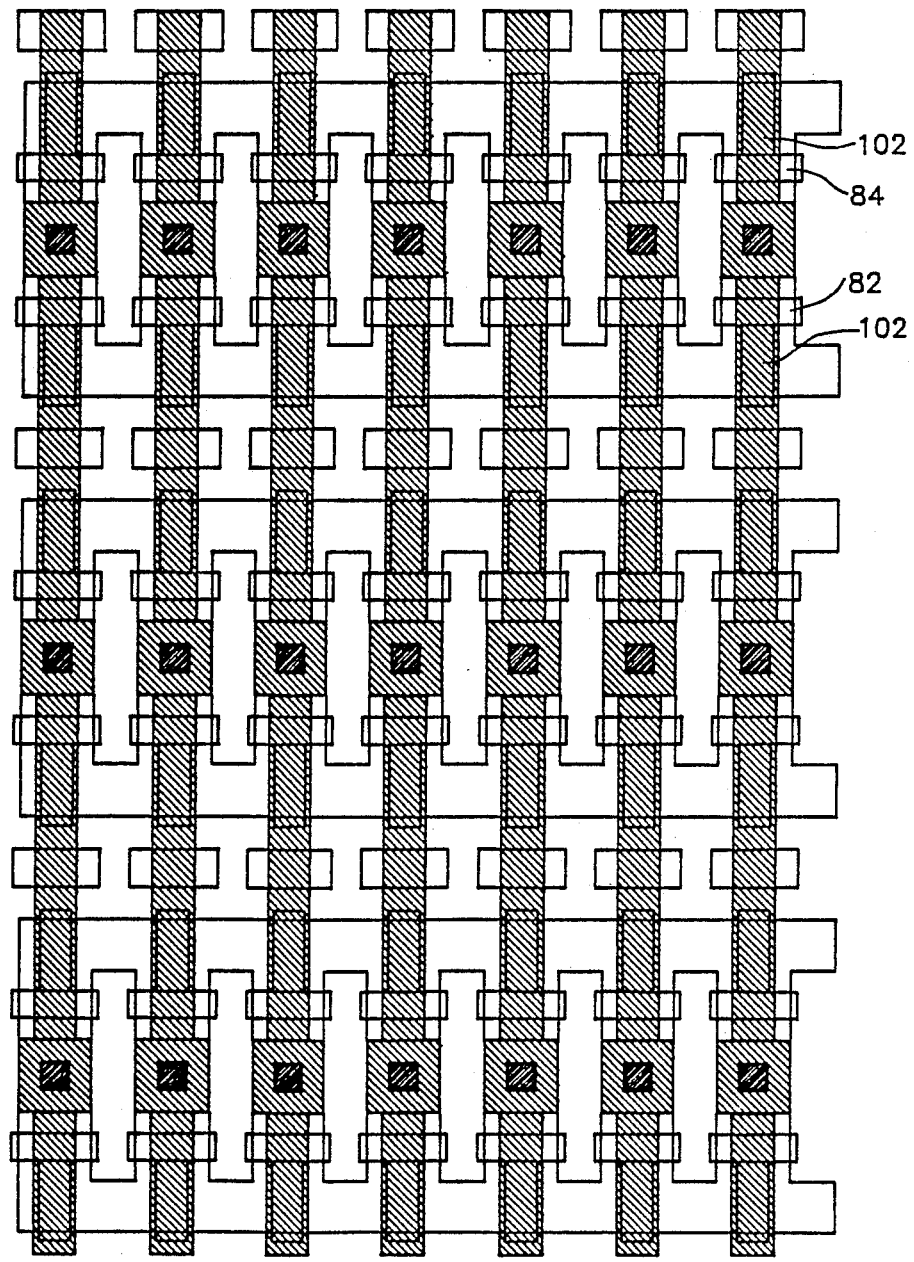
Figure 8:
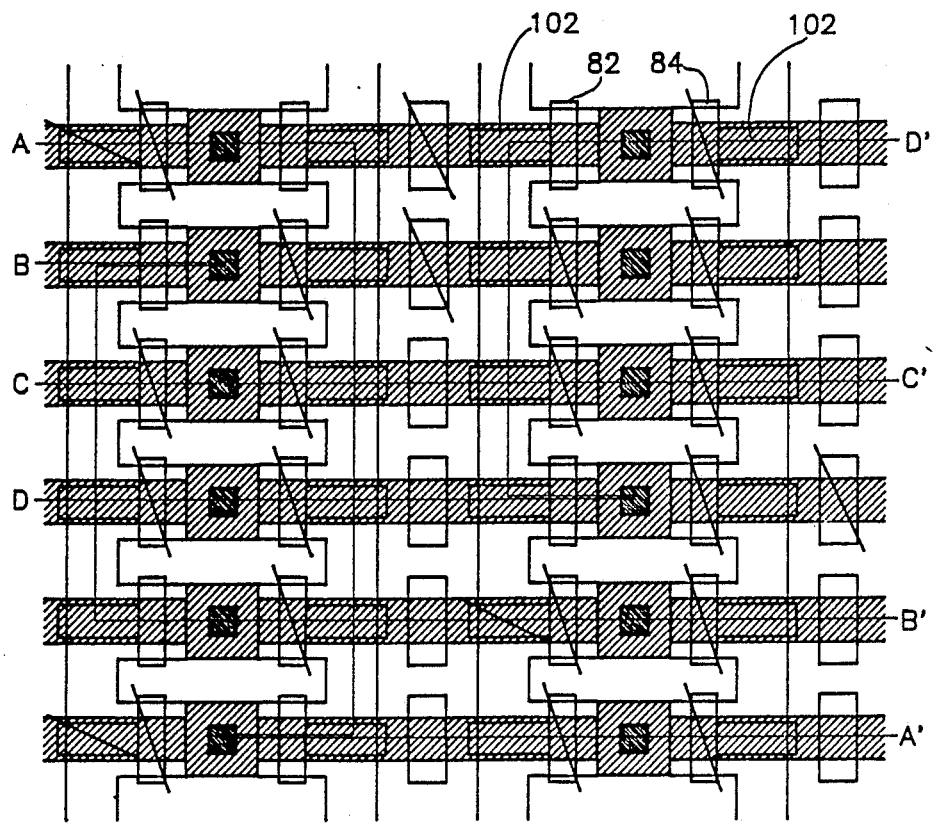
Figure 9:
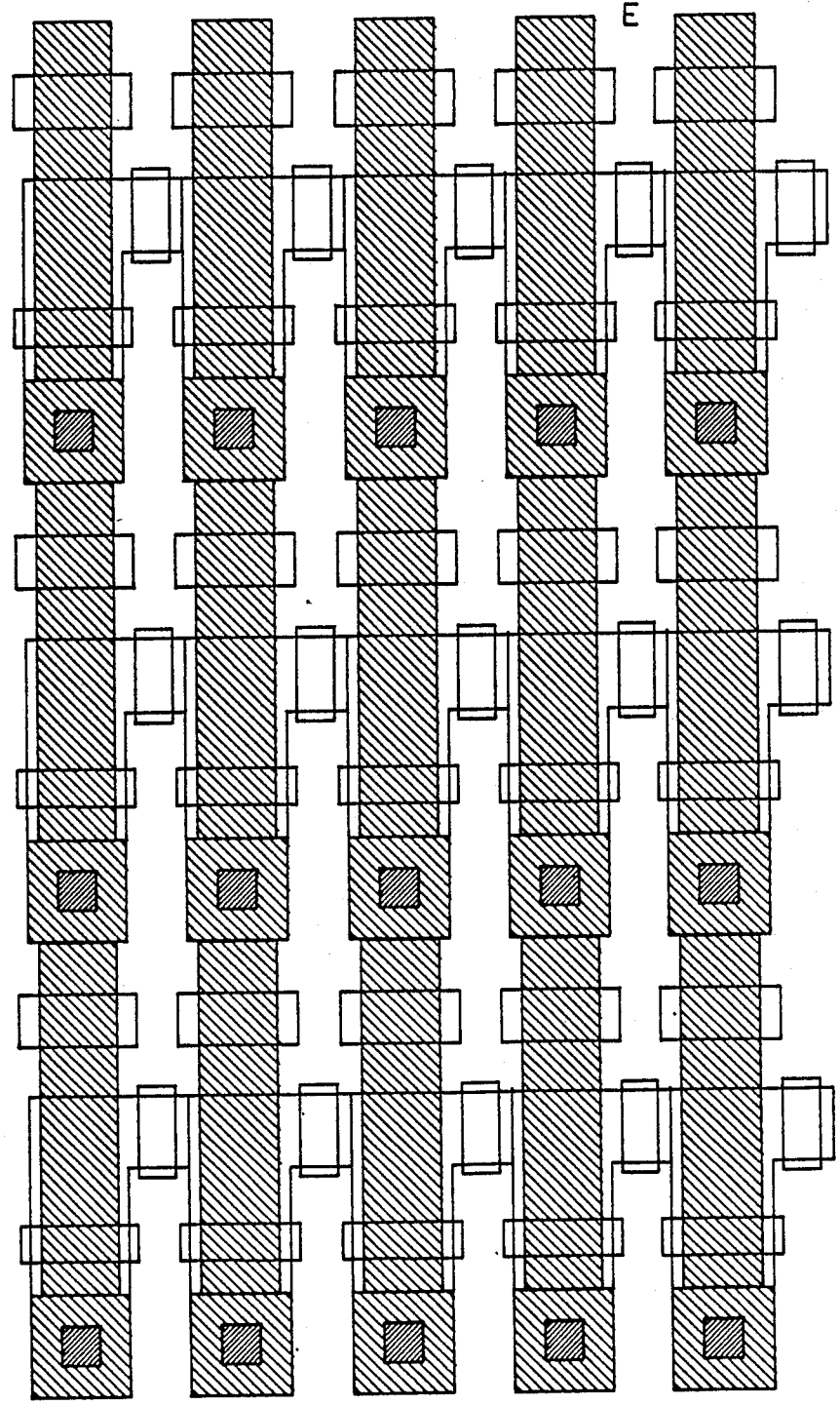
Figure 10:
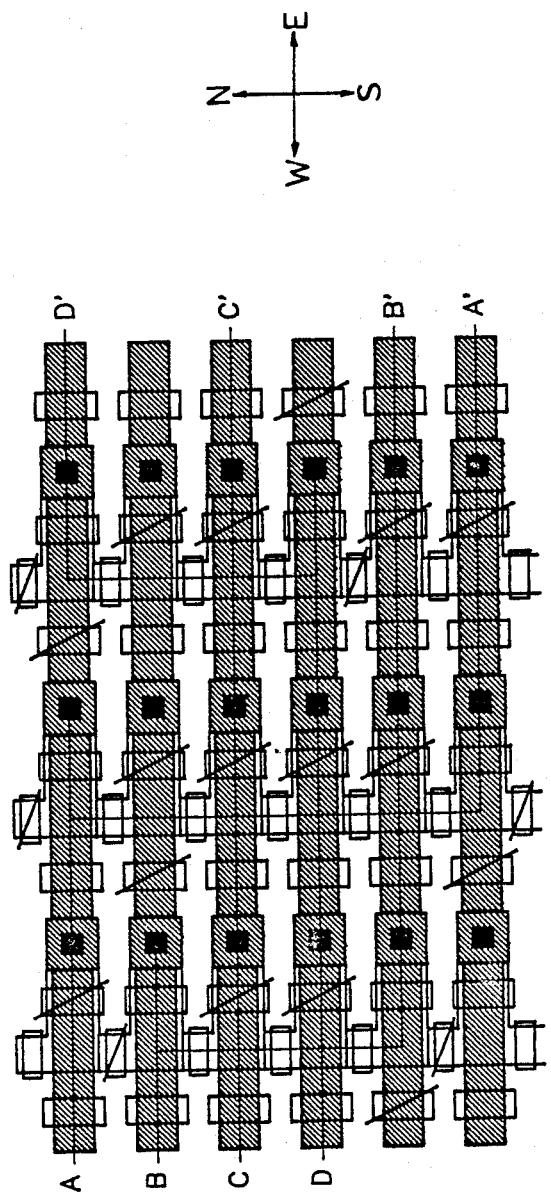
Figure 11:
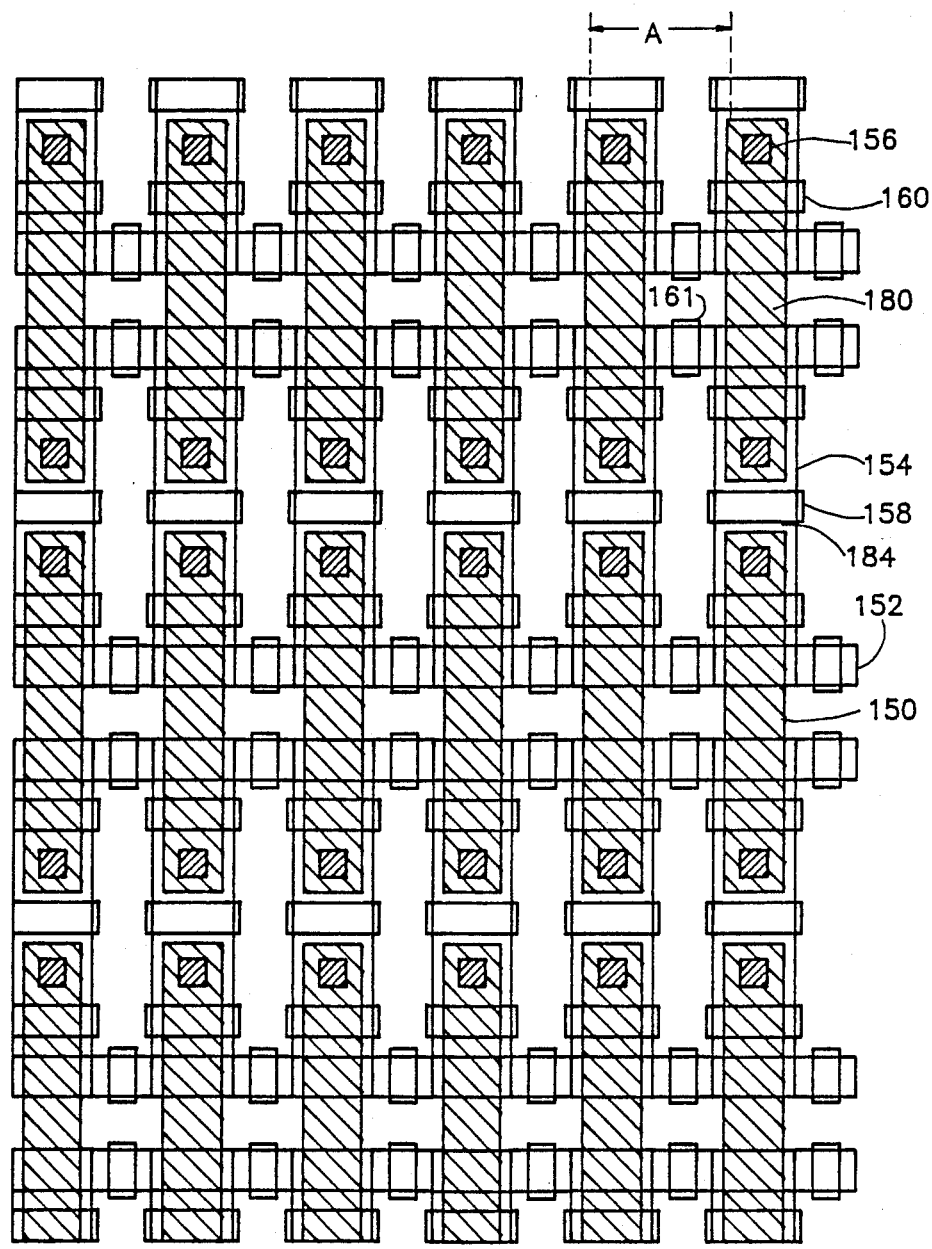
Figure 12:
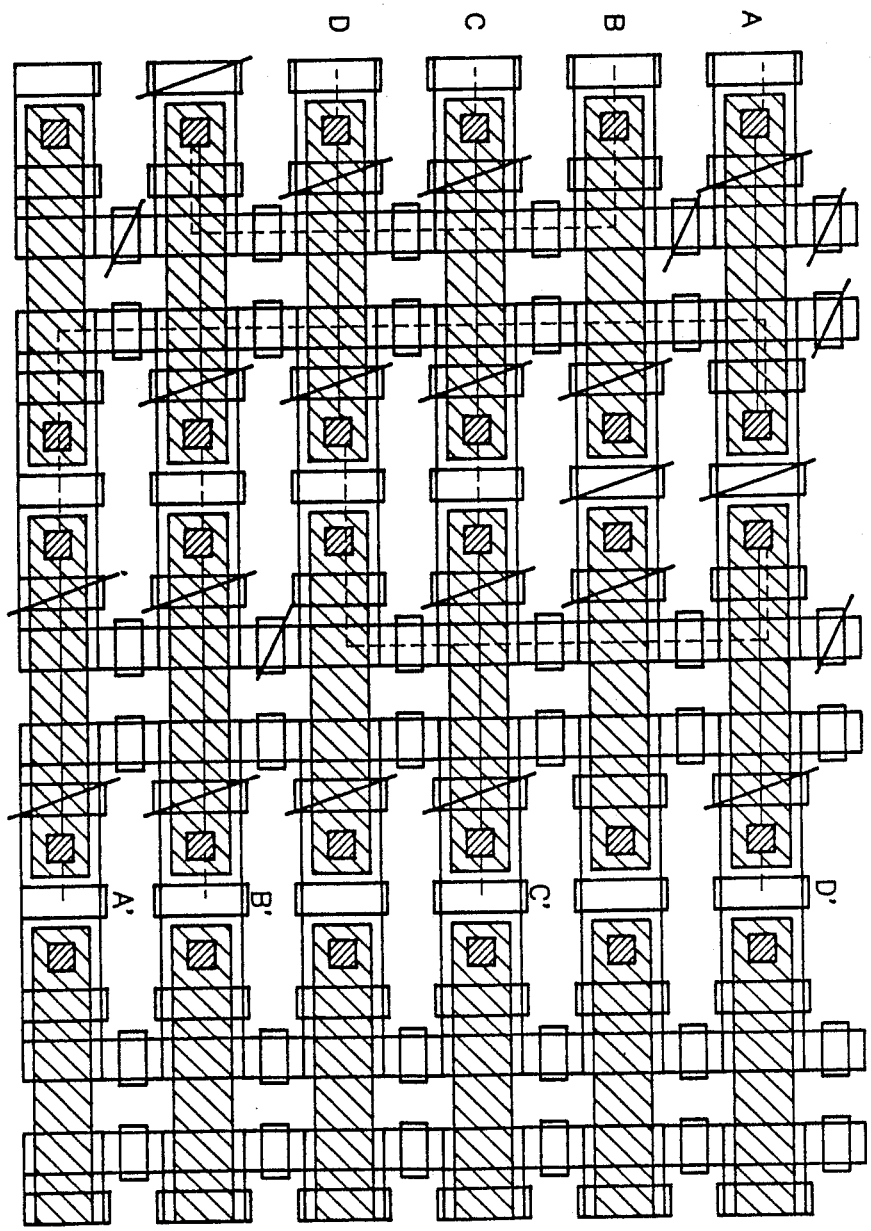
Figure 13:
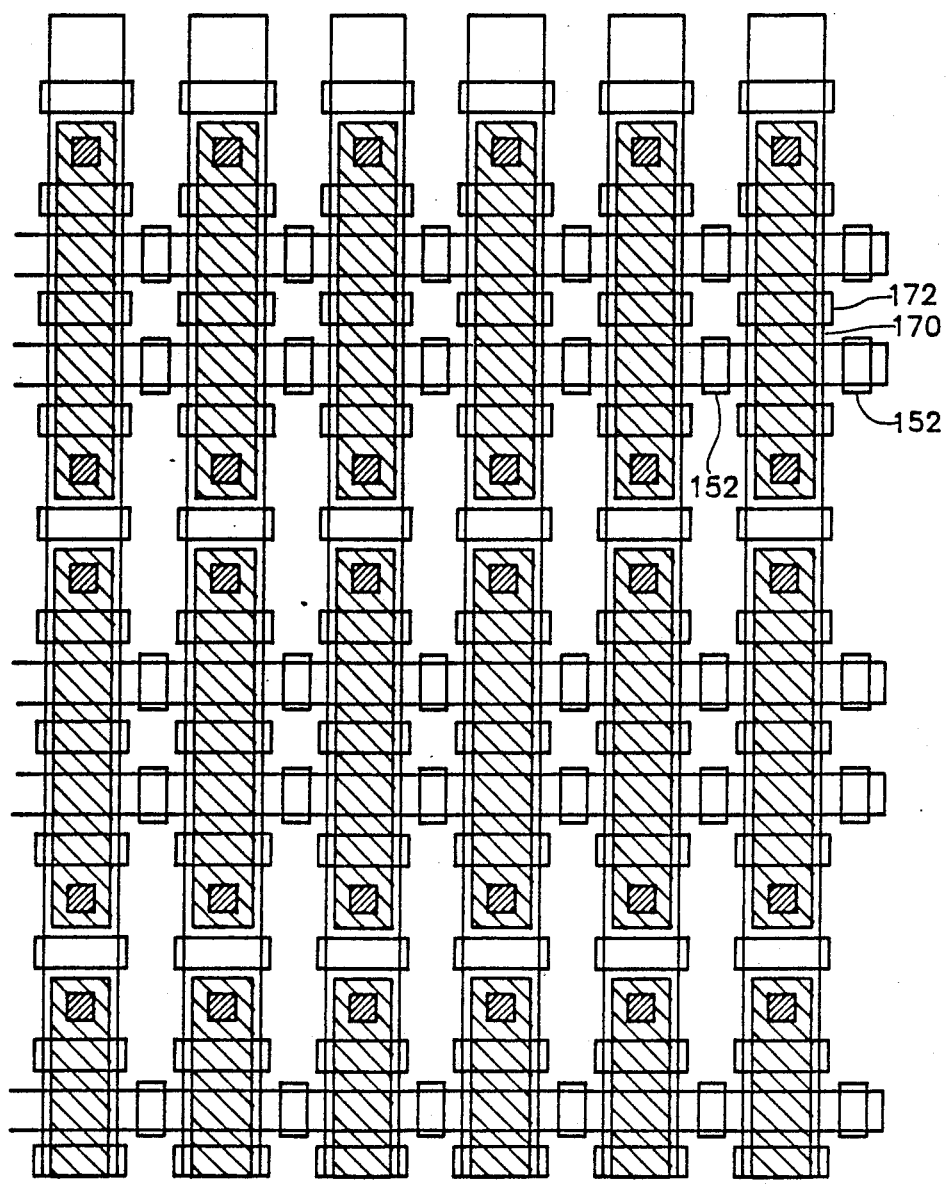
Figure 14:
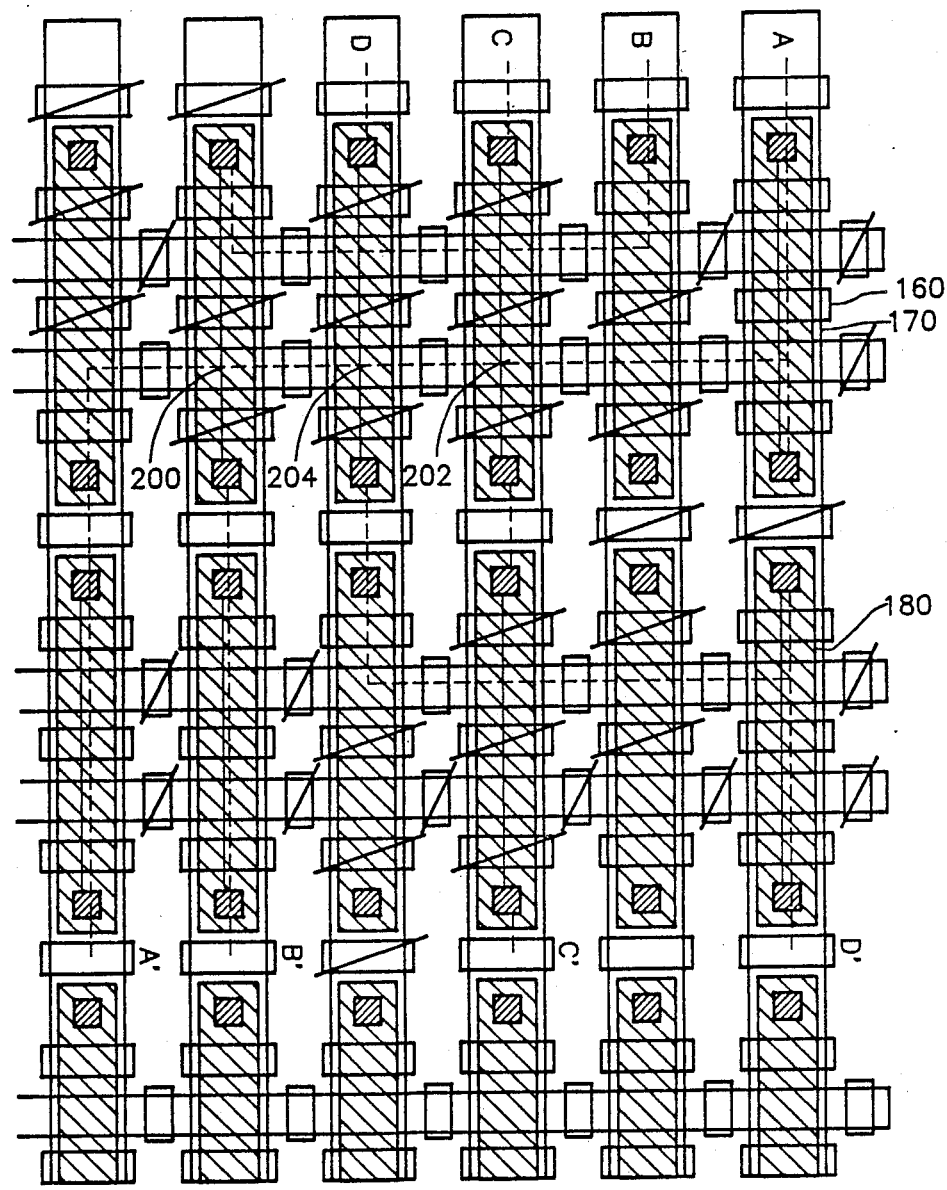

FIG. BA - 2 illustrates a prior art dual metal layout adapted for automatic routing and rapid customization;

FIG. BA - 3 illustrates a prior art equivalent circuit to that of FIG. BA - 1 in the general structure shown in FIG. BA - 2;

FIG. 1 is an enlarged illustration of a metal on metal structure of a gate array according to a preferred embodiment of the invention;

FIG. 2 is an enlarged illustration of a metal on metal structure of a gate array according to another preferred embodiment of the invention;

FIG. 3 is an enlarged illustration of a metal on metal structure of a gate array according to still another preferred embodiment of the invention;

FIG. 4 is an enlarged illustration of the structure of 3 configured to define the layout of FIG. BA - 1;

FIG. 5 is an enlarged illustration of the structure of FIG. 2 configured to define the layout of FIG. BA - 1;

FIG. 6 is an enlarged illustration of the structure of FIG. 1 configured to define the layout of FIG. BA - 1;

FIG. 7 is an enlarged illustration of a metal on metal structure of a gate array according to yet another preferred embodiment of the present invention;

FIG. 8 is an enlarged illustration of the structure of FIG. 7 configured to define the layout of FIG. BA - 1;

FIG. 9 is an enlarged illustration of a metal on metal structure of a gate array according to still another preferred embodiment of the present invention; and FIG. 10 is an enlarged illustration of the structure of FIG. 9 configured to define the layout of FIG. BA - 1.

DETAILED DESCRIPTION OF THE INVENTION

For the purpose of ease of understanding the specification which follows, the drawings have been arranged and labeled such that the metal I strips extend East-West and metal II strips extend North-South. The term "first metal layer" normally refers to the metal I layer and the term "second metal layer" normally refers to the metal II layer. However, in the embodiments of FIGS. 1, 2, 5 and 6 the term "first metal layer" may alternatively refer to the metal II layer and correspondingly the terms "second metal layer" may then refer to the metal I layer.

Reference is now made to FIG. 1, which illustrates a metal on metal structure of a gate array constructed and operative in accordance with a preferred embodiment of the present invention. The structure of FIG. 1 is similar to that shown in FIG. BA - 2 but provides sharing of vias by two adjacent strips. This arrangement has been found to be highly effective in providing enhanced compactness. For convenience in description, directions East, West, North and South are defined on FIG. 1 and the remaining figures. These designations have no other significance and do not indicate any preferred orientation of the gate array or of the metal structure thereof.

A first metal layer 10, typically metal I, is disposed in the plane of the paper and comprises a plurality of parallel elongate strips 12, extending East-West. A second metal layer 14, typically metal II. is disposed in a plane generally parallel to the plane of the first metal layer and is electrically insulated therefrom. The second metal layer comprises a plurality of parallel elongate strips 16, extending North-South.

It is noted that the regions at which the strips 12 and 16 overlap in electrically insulative relationship are here termed elongate strip overlap locations and are indicated by reference numerals 18.

Interconnecting adjacent pairs of elongate strips 12 are a plurality of branch strips 20. Formed on each of branch strips 20 are a pair of fusible links 22 and 24. Intermediate the fusible links 22 and 24 there is provided a branch link 25 which extends to a location underlying a strip 16, termed a branch overlap location and indicated by reference numeral 26. It is noted that branch overlap locations 26 are not found at elongate strip overlap locations 18.

At each branch overlap location 26 there is defined a via 28, providing electrical communication between the branch link 25 and the elongate strip 16.

Additionally fusible links 30 are provided along strip 16 between adjacent pairs of strips 12. Fusible links 32 are provided along strips 12 between adjacent strips 16.

It will be appreciated by persons skilled in the art that desired conductive paths may be provided by selectable fusing of links 22, 24, 30 and 32.

Reference is now made to FIG. 6, which illustrates the structure of FIG. 1 which has been customized to correspond to the circuit layout of FIG. BA - 1. Fuses which have been fused are shown with a superimposed /.

Reference is now made to FIG. 2. In this embodiment a metal layer 40, typically metal 11, is disposed in the plane of the paper and comprises a plurality of parallel elongate strips 42, extending North-South. A metal layer 44, typically metal I. is disposed in a plane generally parallel to the plane of the first metal II layer and is electrically insulated therefrom. The second metal I layer comprises a plurality of parallel elongate strips 46, extending East-West.

It is noted that the regions at which the strips 42 and 46 overlap in electrically insulative relationship are here termed elongate strip overlap locations and are indicated by reference numerals 48.

Interconnecting adjacent pairs of elongate strips 46 are a plurality of branch strips 50. Unlike branch strips 20 of the embodiment of FIG. 1, here the branch strips are not straight but rather bend, defining a pair of bent arms extending across strips 42. Formed on each of branch strips 50 are a pair of fusible links 52 and 54. Intermediate the fusible links 52 and 54 is the location where the branch strip underlies a strip 42., this location being termed a branch overlap location and being indicated by reference numeral 56. It is noted that branch overlap locations 56 are not found at elongate strip overlap locations 48.

At each branch overlap location 56 there is defined a via 58, providing electrical communication between the branch 50 and the elongate strip 42.

Additionally fusible links 60 are provided along strip 46 between adjacent pairs of strips 42. Fusible links 62 are provided along strips 42 between adjacent strips 46.

It will be appreciated by persons skilled in the art that desired conductive paths may be provided by selectable fusing of links 52, 54, 60 and 62.

It is noted that the branch overlap locations 56 overlapping adjacent parallel elongate strips are offset from each other such that they are not all aligned along a single line extending perpendicular to said parallel elongate strips.

The structure of FIG. 2 is particularly useful when due to the requirements of fabrication technology, the size of the vias is relatively large. In such a case a particularly compact result is achieved by offsetting the adjacent vias.

Reference is now made to FIG. 5, which illustrates the structure of FIG. 2 which has been customized to correspond to the circuit layout of FIG. BA - 1. Fuses which have been fused are shown with a superimposed /.

Reference is now made to FIG. 3 which illustrates an even more compact grid array than that shown in FIGS. 1 and 2. In this embodiment a metal layer 70, typically metal II, is disposed in the plane of the paper and comprises a plurality of parallel elongate strips 72, extending North-South. A metal layer 74, typically metal I, is disposed in a plane generally parallel to the plane of the metal II layer and is electrically insulated therefrom. The metal I layer comprises a plurality of parallel elongate strips 76, extending East-West.

It is noted that the regions at which the strips 72 and 76 overlap in electrically insulative relationship are here termed elongate strip overlap locations and are indicated by reference numerals 78.

Interconnecting adjacent pairs of elongate strips 72 are a plurality of branch strips 80. Unlike branch strips 20 of the embodiment of FIG. 1 and branch strips 60 of the embodiment of FIG. 3 here the branch strips are straight and extend in overlapping relationship with strips 76.

Formed on each of branch strips 80 are a pair of fusible links 82 and 84. Intermediate the fusible links 82 and 84 is a branch overlap location indicated by reference numeral 86. It is noted that branch overlap locations 86 are not found at elongate strip overlap locations 78.

At each branch overlap location 86 there is defined a via 88, providing electrical communication between the branch 80 and the elongate strip 76.

Additionally fusible links 90 are provided along strip 76 between adjacent pairs of links 92 are provided along strips 72 between adjacent strips 76.

The structure of FIG. 3 is highly compact but requires the ability to fuse a metal II fuse without disturbing an underlying metal I strip.

Reference is now made to FIG. 4, which illustrates the structure of FIG. 3 which has been customized to correspond to the circuit layout of FIG. BA - 1. Fuses which have been fused are shown with a superimposed /.

Reference is now made to FIG. 7 which illustrates an even more compact grid array than that shown in FIG. 3. The arrangement is identical to that of FIG. 3 with the exception that fuses 92 are eliminated and replaced by fuses 102 which are located on strips 72 in overlapping relationship with strips 76, adjacent to respective fuses 82 and 84. It will be appreciated that whenever a fuse 92 is fused, the adjacent fuse 82 or 84 will already have been fused.

The arrangement of FIG. 7 has a number of advantages: All of the fusible links are aligned along strips 76. The elimination of fuses 92 enables the strips 76 to be brought closer to each other, so that the entire layout is more compact. The alignment of all of the fusible links along given lines, enables relatively easy arrangement of a multi-metal layer arrangement.

The arrangement of FIG. 7 also has a disadvantage in somewhat limiting the possible routing arrangements which can be realized by the layout, as compared with the embodiment of FIG. 3.

Reference is now made to FIG. 8, which illustrates the structure of FIG. 7 which has been customized to correspond to the circuit layout of FIG. BA - 1. Fuses which have been fused are shown with a superimposed /.

Reference is now made to FIG. 9 which illustrates a somewhat simplified and less compact grid array than that shown in FIG. 3, wherein the shared vias of the configuration of FIG. 3 are eliminated and branches 80 do not interconnect adjacent strips 72. It is noted that the particular fuse arrangement of FIG. 7, wherein a fuse on one metal layer overlaps another metal layer, may be incorporated in the embodiment of FIG. 9. Every second strip 72 is eliminated.

The arrangement of FIG. 9 has a disadvantage in somewhat decreased compactness, as compared with the embodiment of FIG. 3.

Reference is now made to FIG. 10, which illustrates the structure of FIG. 9 which has been customized to correspond to the circuit layout of FIG. 8A - 1. Fuses which have been fused are shown with a superimposed /.

It will be appreciated by persons skilled in the art that the present invention is not limited by what has been particularly shown and described herein. Rather the scope of the present invention is defined only by the claims which follow:

We claim:

1. A selectably customizable semiconductor device comprising:
   a first metal layer disposed in a first plane and including first elongate strips extending parallel to a first axis;
   a second metal layer disposed in a second plane generally parallel to and electrically insulated from said first plane and including second elongate strips extending parallel to a second axis, said second axis being generally perpendicular to said first axis, whereby a multiplicity of elongate strip overlap locations are defined at which the elongate strips of said first and second metal layers lie in overlapping electrical insulating relationship;
   said first metal layer including a plurality of fusible conductive bridges joining adjacent pairs of said first elongate strips, said fusible conductive bridges including first and second fusible links;
   said first metal layer also including a plurality of branch strips, each branch strip connecting one of said fusible conductive bridges at a location intermediate said first and second fusible links to a branch overlap location spaced from said multiplicity of elongate strip overlap locations,
   a via extending between said first metal layer and said second metal layer at each of said branch overlap locations.

2. A selectably customizable semiconductor device according to claim 1 and also comprising a fusible link formed on each strip of said pair of adjacent first elongate strips intermediate each pair of adjacent fusible conductive bridges.

3. A selectably customizable semiconductor device according to claim 1 and also comprising a fusible link formed on each of said second elongate strips intermediate each pair of adjacent branch overlap locations.

4. A selectably customizable semiconductor device according to claim 2 and also comprising a fusible link formed on each of said second elongate strips intermediate each pair of adjacent branch overlap locations.

5. A selectably customizable semiconductor device comprising:
   a first metal layer disposed in a first plane and including first elongate strips extending parallel to a first axis;
   a second metal layer disposed in a second plane generally parallel to and electrically insulated from said first plane and including second elongate strips extending parallel to a second axis, said second axis being generally perpendicular to said first axis, whereby a multiplicity of elongate strip overlap locations are defined at which the elongate strips of said first and second metal layers lie in overlapping electrical insulating relationship;
   said first metal layer including a plurality of fusible conductive bridges joining adjacent pairs of said first elongate strips, said fusible conductive bridges including first and second fusible links;
   a via extending between said first metal layer and said second metal layer at a plurality of branch overlap locations, said branch overlap locations being disposed along a fusible conductive bridge intermediate said first and second fusible links and overlapping said second elongate strips intermediate adjacent elongate strip overlap locations,
   and wherein branch overlap locations at adjacent second elongate strips are offset from each other such that they are not all aligned along a single line extending perpendicular to said second elongate strips.

6. A selectably customizable semiconductor device according to claim 5 and also comprising a fusible link formed on each strip of said pair of adjacent first elongate strips intermediate each pair of adjacent fusible conductive bridges.

7. A selectably customizable semiconductor device according to claim 5 and also comprising a fusible link formed on each of said second elongate strips intermediate each pair of adjacent branch overlap locations.

8. A selectably customizable semiconductor device according to claim 6 and also comprising a fusible link formed on each of said second elongate strips intermediate each pair of adjacent branch overlap locations.

9. A selectably customizable semiconductor device comprising:
   a metal II layer disposed in a first plane and including first elongate strips extending parallel to a first axis;
   a metal I layer disposed in a second plane generally parallel to and electrically insulating from said first plane and including second elongate stripe extending parallel to a second axis, said second axis being generally perpendicular to said first axis, whereby a multiplicity of elongate strip overlap locations are defined at which the elongate strips of said metal layers lie in overlapping electrical insulating relationship;
   said metal II layer including a plurality of fusible conductive bridges joining adjacent pairs of said first elongate strips, said fusible conductive bridges including first and second fusible links;
   a via extending between said metal II layer and said metal I layer at a plurality of branch overlap locations, said branch overlap locations being disposed along a fusible conductive bridge intermediate said first and second fusible links and overlapping said second elongate strips intermediate adjacent elongate strip overlap locations,
   and wherein each of said fusible conductive bridges lies in overlapping codirectional relationship with said second elongate strips.

10. A selectably customizable semiconductor device according to claim 9 and also comprising a third fusible link formed on each strip of said pair of adjacent first elongate strips intermediate each pair of adjacent fusible conductive bridges.

11. A selectably customizable semiconductor device according to claim 9 and also comprising a third fusible link formed on each strip of said pair of adjacent first elongate strips at each fusible conductive bridge.

12. A selectably customizable semiconductor device according to claim 11 and wherein a fusible link is disposed adjacent to each of said first and second fusible links.

13. A selectably customizable semiconductor device according to claim 9 and also comprising a fusible link formed on each of said second elongate strips intermediate each pair of adjacent branch overlap locations.

14. A selectably customizable semiconductor device comprising:
- a metal II layer disposed in a first plane and including first elongate strips extending parallel to a first axis;
- a metal I layer disposed in a second plane generally parallel to and electrically insulated from said first plane and including second elongate strips extending parallel to a second axis, said second axis being generally perpendicular to said first axis, whereby a multiplicity of elongate strip overlap locations are defined at which the elongate strips of said metal layers lie in overlapping electrical insulating relationship;
- said metal II layer including a plurality of fusible conductive branches joined to said first elongate strips, said fusible conductive branches including a first fusible link;
- a via extending between said metal II layer and said metal I layer at a plurality of branch overlap locations, said branch overlap locations being disposed along a fusible conductive branch overlapping said second elongate strips intermediate adjacent elongate strip overlap locations,
- and wherein each of said fusible conductive branches lies in overlapping codirectional relationship with said second elongate strips.

15. A selectably customizable semiconductor device according to claim 14 and also comprising a second fusible link formed on each first elongate strip intermediate each pair of adjacent fusible conductive branches.

16. A selectably customizable semiconductor device according to claim 14 and also comprising a second fusible link formed on each first elongate strip at each fusible conductive branch.

17. A selectably customizable semiconductor device according to claim 14 and also comprising a fusible link formed on each of said second elongate strips intermediate each pair of adjacent branch overlap locations.

18. A selectably customizable semiconductor device according to claim 1 and wherein said first metal layer is a metal I layer and said second metal layer is a metal II layer.

19. A selectably customizable semiconductor device according to claim 7 and wherein said first metal layer is a metal I layer and said second metal layer is a metal II layer.

20. An at least partially customized semiconductor device according to claim 1 and wherein at least some of said fusible links are fused.

21. An at least partially customized semiconductor device according to claim 9 and wherein at least some of said fusible links are fused.

22. An at least partially customized semiconductor device according to claim 7 and wherein at least some of said fusible links are fused.

23. An at least partially customized semiconductor device according to claim 14 and wherein at least some of said fusible links are fused.

24. A semiconductor device according to claim 1 and wherein said first and second elongate strips are arranged in a regular grid pattern.

25. A semiconductor device according to claim 7 and wherein said first and second elongate strips are arranged in a regular grid pattern.

26. A semiconductor device according to claim 9 and wherein said first and second elongate strips are arranged in a regular grid pattern.

27. A semiconductor device according to claim 14 and wherein said first and second elongate strips are arranged in a regular grid pattern.

* * * * *